(12) United States Patent
Oshima et al.

(10) Patent No.: US 6,677,562 B2
(45) Date of Patent: Jan. 13, 2004

(54) HIGH-FREQUENCY HEATING APPARATUS AND COOLING SYSTEM FOR MAGNETRON-DRIVING POWER SUPPLY UTILIZED IN THE APPARATUS

(75) Inventors: Kosho Oshima, Nara (JP); Masato Yamauchi, Kyoto (JP); Hiroshi Sumi, Ikoma (JP); Yukio Abe, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/095,177

(22) Filed: Mar. 11, 2002

(65) Prior Publication Data

US 2002/0153371 A1 Oct. 24, 2002

(30) Foreign Application Priority Data

| Mar. 13, 2001 | (JP) | P.2001-069963 |
| Apr. 17, 2001 | (JP) | P.2001-117861 |
| Apr. 17, 2001 | (JP) | P.2001-117862 |

(51) Int. Cl.$^7$ ............................................... H05B 6/68
(52) U.S. Cl. .................. 219/710; 219/705; 219/757; 219/716
(58) Field of Search ................. 219/702, 704, 219/705, 710, 711, 715, 716, 723, 757, 720

(56) References Cited

U.S. PATENT DOCUMENTS

| 4,481,393 A | * 11/1984 | Ueda ........................... 219/720 |
| 5,021,620 A | * 6/1991 | Inumada ...................... 219/716 |
| 5,268,547 A | * 12/1993 | Bessyo et al. ............... 219/716 |
| 5,302,793 A | * 4/1994 | Eke ............................ 219/710 |
| 5,422,465 A | * 6/1995 | Kim et al. ................... 219/705 |
| 5,968,402 A | * 10/1999 | Lee ............................. 219/720 |

FOREIGN PATENT DOCUMENTS

| JP | 4-249886 | * 9/1992 | ................. 219/710 |
| JP | 5-258853 | * 10/1993 | ................. 219/667 |
| JP | 6-50550 | 2/1994 | |

* cited by examiner

Primary Examiner—Philip H. Leung
(74) Attorney, Agent, or Firm—Pearne & Gordon LLP

(57) ABSTRACT

This invention provides a high-frequency heating apparatus for heating by using magnetron including an inverter power supply as a magnetron-driving power supply, a cooling fan, and an air guide. The cooling fan is inclined against the vertical direction of the power supply and fitted to the air guide. This structure increases the cooling effect of the power supply. Additionally, the power supply includes temperature sensors provided on semiconductor elements and a controller for controlling the power supply and an operation of the heating apparatus according to the result of the sensors. These sensors avoid breaking down of the power supply caused by overheating.

7 Claims, 20 Drawing Sheets

PRIOR ART

PRIOR ART

HIGH-FREQUENCY HEATING APPARATUS AND COOLING SYSTEM FOR MAGNETRON-DRIVING POWER SUPPLY UTILIZED IN THE APPARATUS

BACKGROUND OF THE INVENTION

1. Field of the Invention

The present invention relates to a high-frequency heating apparatus including an inverter power supply as the power source for performing dielectric heating by using magnetron such as a microwave oven. The invention also relates to a cooling construction of a magnetron-driving power supply of the high-frequency heating apparatus. The present invention further relates to a power control method for the safe operation of a high-frequency power supply apparatus and for the overheat protection of the detection performance of a cooking detection sensor.

2. Description of the Related Art

A magnetron-driving power supply, in which a high-voltage circuit, a low-voltage circuit, and a leakage transformer are integrated on a printed circuit board and which is a so-called inverter circuit, has been widely used as a microwave oven power supply. FIG. 6 is a front and side view of a prior-art magnetron-driving power supply.

As such, respective components are integrally mounted on one board and provided as one unit board. 1 denotes a leakage transformer, and 2 denotes a radiating fin for cooling a power switching element. FIG. 7 is a block diagram showing an inverter circuit.

Voltage from a commercial power supply is converted to a unidirectional voltage by a unidirectional power supply portion 3 composed of diode bridges. The unidirectional voltage undergoes current smoothing and voltage smoothing by a rectifying filter 6 composed of a choke coil 4 and a smoothing capacitor 5. Output from the rectifying filter 6 is converted to high-frequency power of 30–50KHz by an inverter portion 7. As a method for this inverter portion, various styles including a voltage resonant type, a current resonant type, a partial resonant type, and a half-bridge method are applicable. The electric power is converted to high-frequency high-voltage by the leakage transformer 1. This high-frequency voltage is converted to a direct current high voltage by means of a high-voltage rectifying means 8 composed of a capacitor and a diode.

The leakage transformer 1 includes tertiary winding, supplies electric power to a filament of a magnetron 9 through a high-voltage lead wire 10, and makes electrons radiate from a cathode. On the other hand, the voltage which has been converted to a direct current high voltage by the high-voltage rectifying means 8 is applied, similarly through the high-voltage lead wire 10, to an anode-cathode section of the magnetron 9 and radiates a microwave output into a microwave oven, thereby heating food by dielectric heating. Moreover, the inverter portion 7 is controlled by an inverter control portion 11, and a power switching element inside the inverter portion 7 is ON/OFF controlled. A magnetron-driving power supply 12 is constructed by the above construction. In addition, 13 is connected to a chassis to be a ground potential.

Next, FIG. 6 is a front and side view of a magnetron-driving power supply 12, which have been already described, and 14 denotes a power switching element, which is screwed on the radiating fin 2 to be closely fitted. Loss of this power switching element 14 is conducted as heat to the radiating fin 2 and cooled by forcedly cooling air together with the radiating fin 2. 15 denotes a high-pressure capacitor and 16 denotes a high-pressure diode, thereby constructing a high-pressure rectifying means 8. All of these components are mounted on a paper phenol board 17, thus constructing the integrated magnetron-driving power supply 12, which has been described for FIG. 7. As this inverter method, a dual transistor method is assumed, therefore, two power switching elements 14 are provided.

The radiating fin is constructed by a group of fins laterally protruding from a core portion which is in the parallel direction with respect to the transistor, and is cooled by air passing therethrough. The power switching element 14 is connected to the radiating fin 2 with heat-conductive silicone grease or the like sandwiched therebetween and transmits heat to the radiating fin 2. When the fin group of the radiating fin 2 is sufficiently exposed to the air, it is unnecessary to use a very expensive low-loss power switching element as a power switching element 14. Also, the magnetron-driving power supply 12 is completed in this condition, therefore, it is unnecessary to prepare an assortment of various models according to the setting type and extremely unified and efficient manufacturing can be realized.

In a magnetron-driving power supply using this inverter circuit, it is very common that cooling of the respective components is performed by forced cooling by the cooling fan. FIG. 8 is a cooling constructional view of a prior-art magnetron-driving power supply. 18 denotes a cooling fan, which is activated by a motor 19. In addition, 20 denotes an orifice of the cooling fan. In addition, 21 denotes an air guide for guiding air from the cooling fan to a magnetron-driving power supply 12. The air from the cooling fan is centralized by this air guide 21 so as to contact the magnetron-driving power supply 12. FIG. 9 is a cooling constructional view in a case of transmission through the air guide 21. The most significant theme is cooling the radiating fin 2 connected to the leakage transformer 1 and a power switching element 14 whose temperature is most intensive. FIG. 10 is a view showing airflow with a prior-art cooling construction. When a propeller fan is used as a cooling fan, outflow of the air from the cooling fan becomes radial in the direction A. Accordingly, the air A from the cooling fan, first, contacts a part of the air guide 21-P then flows in the direction A' of the drawing. Accordingly, the air velocity of A' considerably decreases compared to the initial air A flowed out from the cooling fan. Moreover, air B which is directly parallel with the axial direction of the cooling fan directly contacts the magnetron-driving power supply, however, the air force is weak compared to that of the air A flowing out radially. Accordingly, although the air of the cooling fan cannot be effectively utilized perfectly, an advantage such as a simple cooling construction exists, therefore, such a cooling construction has been conventionally used.

However, in recent years, with strong demand for a higher microwave oven output, power consumption of a magnetron-driving power supply, in particular, power consumption of a switching element and a leakage transformer has become remarkably high. Accordingly, it has become necessary to design a more efficient cooling construction for a magnetron-driving power supply. In addition, in order to deal with downsizing and novel designs of microwave ovens, restrictions on a machine room space for a cooling system, a magnetron-driving power supply, etc., have became stricter and an efficient cooling construction within a limited space has become necessary.

Such a high-frequency heating apparatus using an inverter power supply as the power source is disclosed, for example, in Japanese Unexamined Patent Publication No. Hei-6-50550. FIG. 14 and FIG. 15 show the high-frequency heating apparatus according to the prior art disclosed in the above-mentioned publication.

FIG. 14 is a cross sectional view showing a power supply section in the high-frequency heating apparatus. Numeral 31 indicates a heating chamber. Numeral 32 indicates a magnetron for generating high-frequency power. Numeral 33 indicates an inverter power supply for supplying power to the magnetron. Numeral 34 indicates a cooling fan for cooling the power supply section.

FIG. 15 is a perspective view showing the appearance of the inverter power supply 33. Numeral 35 indicates a semiconductor rectifier element for rectifying the commercially available electric power. Numeral 36 indicates a semiconductor switching element for converting the rectified power into high-frequency power. Numeral 37 indicates a high-voltage transformer for converting the high-frequency power into high voltage and thereby supplying the power to the magnetron 32. Numeral 38 indicates a heat radiation fin to which the semiconductor rectifier element 35 and the semiconductor switching elements 36 are attached.

Nevertheless, in the prior art configuration, the power supplied to the magnetron is supplied through the semiconductor rectifier element 35 and the semiconductor switching elements 36 by inverter scheme. These semiconductor devices have low heat resistivity, and have a disadvantage in that the devices suffer thermal damage easily at a temperature exceeding the heat resistivity limit even for a short period of time. Accordingly, for example, in a case where the cooling fan 34 has stopped due to a failure, the semiconductor rectifier element 35 and the semiconductor switching elements 36 have suffered thermal damage in a short period of time due to self-heat generation.

In some high-frequency heating apparatuses according to the prior art, the magnetron is provided with a temperature switch or the like. When the cooling fan motor fails, an abnormal temperature rise is detected in the magnetron, whereby the operation of the high-frequency heating apparatus is terminated. Nevertheless, in a high-frequency heating apparatus using an inverter power supply, the semiconductor rectifier element and the semiconductor switching elements suffer thermal damage before the abnormal temperature rise is detected in the magnetron. Thus, such a temperature switch does not have the effect of protecting the inverter power supply.

Moreover, in the configuration of a prior art high-frequency heating apparatus, for example, an automatic cooking detection sensor apparatus cannot start automatic cooking when the temperature environment exceeds the limit at the start of cooking, in order to secure performance which would not be secured above the temperature limit. Further, in a case where the temperature environment exceeds the limit during automatic cooking, the cooking is not properly completed. On the other hand, the power supply apparatus comprises means for preventing troubles caused by overheating, however, in a general configuration, the power supplying is forced to terminate by mechanical means during cooking in order to prevent damage to the components due to overheating.

In the above-mentioned configuration according to the prior art there has been a problem wherein when the temperature of the power supply apparatus or the temperature of the cooking detection sensor exceeds the temperature limit for securing function and performance during the supplying of high-frequency power, the power supplying is suddenly terminated by mechanical means even during cooking, and that reason for the suspension in heating is not displayed. Another problem has been that power control cannot be carried out in a simple configuration for detecting temperature changes of varied temperature limit levels.

SUMMARY OF THE INVENTION

The present invention for solving the above-mentioned problems aims to provide a high efficient cooling system within a limited space and a high-frequency heating apparatus including the cooling system. The invention also aims to provide a high-frequency heating apparatus monitoring temperature of an inverter power supply and a mainly components, controlling an output of the inverter power supply according to the monitored information, and avoiding breaking of an inverter power supply caused of overheating. The invention further aims to provide a high-frequency apparatus performing stability in unusual temperature and displaying a fault defect when the heating apparatus cannot cock caused by temperature factor.

In order to solve the above-mentioned problems, the present invention provides a cooling system for a magnetron-driving power supply including a magnetron-driving power supply having those on a printed board, a radiating fin formed by an aluminum extrusion molding method and mounted a power switching element having an IGBT and a such thereon, an inverter portion, an inverter controlling portion for controlling the inverter portion, a leakage transfer for booting a high-frequency alternating voltage, and a high voltage rectifying means for applying direct current high voltage to a magnetron connected to a secondary winding of the leakage transfer, a cooling fan for forcedly cooling the magnetron-driving power supply, and an air guide for guiding air form the cooling fan to the magnetron-driving power supply. In the system, the inverter portion turns on/off electric power of a commercial power supply power at high speed by means of the power switching element and converting the electric power to a high-frequency alternating voltage. The radiating fin cools the power switching element by dispersing loss, which occurs in a closely bound manner with the power switching element. The system is structured so that the axial direction of the cooling fan intersects the printed wiring board of the magnetron-driving power supply at an acute angle, and one end of an opening portion of the air guide is latched with the cooling fan.

Thus, it becomes possible to efficiently contact air from the cooling fan against the magnetron-driving power supply via an air guide, thereby improving cooling efficiency.

In order to resolve the above-mentioned problem, the present invention also provides a high-frequency heating apparatus including an semiconductor rectifier element and semiconductor switching element, both of them are major components of the inverter power supply, characterized in low heat resistivity but a high heat generation rate, and attached a temperature sensors thereto. The heating apparatus also includes a controlling means having a microcomputer for monitoring the temperature of the temperature sensors and for controlling the output of the inverter power supply according to the monitored information.

By the above-mentioned structure of the high-frequency heating apparatus, in a case where an abnormal temperature rise is caused in the semiconductor rectifier element and the semiconductor switching elements for any reason, the output of the inverter power supply is reduced or terminated before the temperature reaches the heat resistivity limit of the components. Accordingly, thermal damage in the inverter power supply is avoided.

In order to resolve the above-mentioned problems, the present invention further provides a high-frequency apparatus including a power supply control means for separately setting a power supply control start temperature setting level for securing performance of the automatic cooking detection sensor due to a temperature factor, a power supply control start temperature setting level for overheat protection of the power supply apparatus against self-heat generation, and a power supply control start temperature setting level for overheat protection of the power supply apparatus during heating when the temperature of the cooling air is high at the start of cooking. Then, when the temperature detected by a temperature sensor reaches the respective temperature limit levels, the high-frequency output is controlled in order to secure normal performance.

By the process of the separately setting above-mentioned, the automatic cooking sensor does not stop during cooking, whereby normal detection performance is secured. Even in cooking by manual time setting other than automatic sensor cooking, the high-frequency output is controlled before the power supply apparatus suffers overheat damage whereby damage is prevented in any change in the cooling temperature environment.

At the start of cooking by automatic cooking sensor detection, even in a case where the cooling temperature environment is so high that the automatic cooking sensor detection cannot be carried out normally owing to the high temperature, the condition is notified to the user. Accordingly, the condition is notified to the user even when completion of automatic sensor cooking is delayed, or when cooking is temporarily stopped.

DETAILED DESCRIPTION OF THE PREFERRED EMBODIMENTS

Hereinafter, an embodiment of the present invention will be described with reference to the drawings.

(First embodiment)

Figure 1:
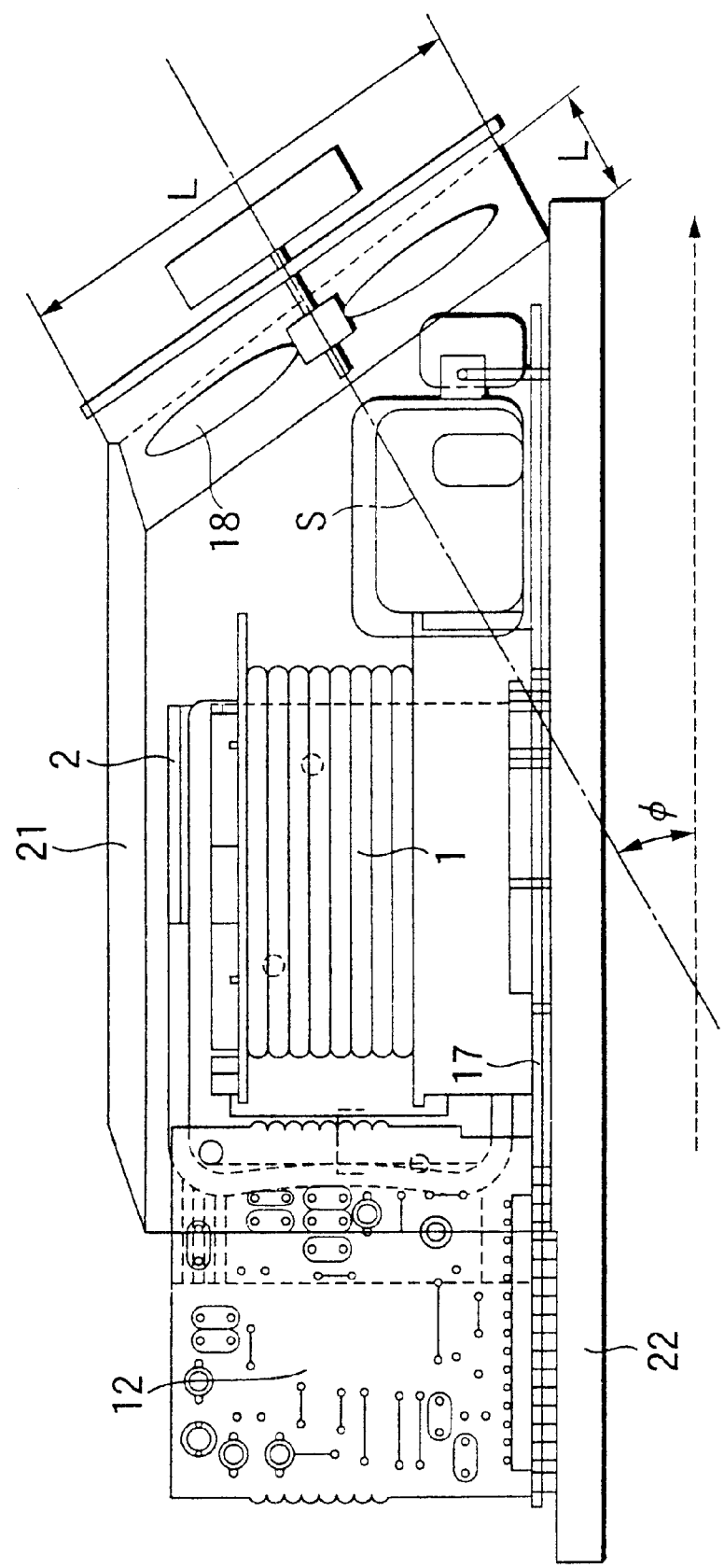
FIG. 1 is a constructional view of a cooling system for a magnetron-driving power supply according to an embodiment of the present invention.

FIG. 1 is a constructional view of a cooling system for a magnetron-driving power supply of the present invention. A construction is employed, wherein the cooling fan 18 is arranged at a position where the axial direction S thereof intersects the horizontal direction of the magnetron-driving power supply, that is, the paper phenol board 17 at an acute angle (angleΦ), and is latched with the opening portion on one end of the air guide 21. The air guide 21 is constructed so as to enclose the magnetron-driving power supply 12 from the longitudinal direction and the upper portion thereof, and two opening portions of the air guide are provided in the horizontal direction with respect to the paper phenol board 17. Air from the cooling fan enters the magnetron-driving power supply via one opening portion of the air guide which is latched with the cooling fan, flows inside the magnetron-driving power supply, and exits from the other opening portion of the air guide 21.

Figure 2:
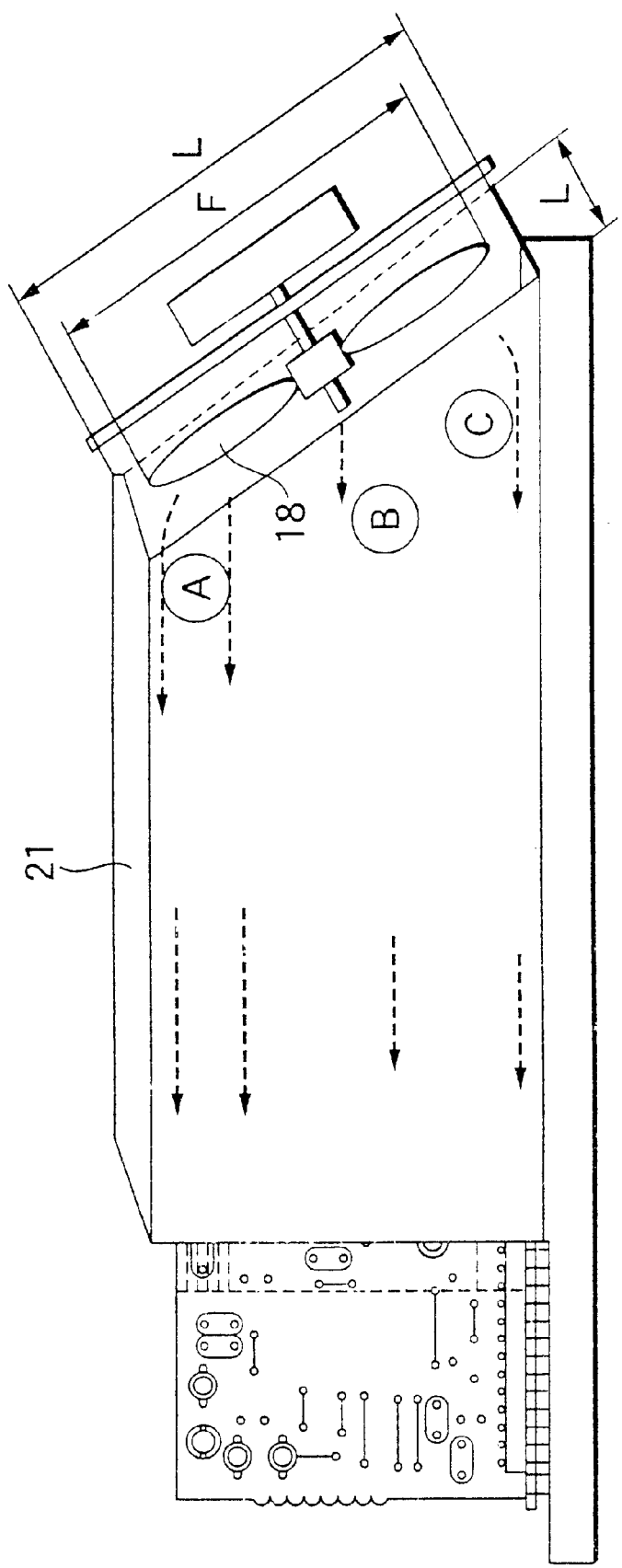
FIG. 2 is a view indicating air directions of a cooling system for a magnetron-driving power supply according to the same.

FIG. 2 is a view showing airflow from a cooling fan with a cooling construction for a magnetron-driving power supply of the present invention. Herein, the size L of the opening portion of the air guide on the side to be latched with the cooling fan is set to be slightly greater than the diameter F of the cooling fan. As for the cooling fan, in general, a propeller fan is used. In such a case, airflow exiting from the cooling fan becomes radial, however, as mentioned above, by taking the size and the axial direction of the air guide opening portion into consideration, the radial air from the cooling fan begins to flow along the air guide wall surface in parallel as shown by A of FIG. 2, thus, unlike the prior art, air velocity does not decrease due to the air guide wall surface. Accordingly, air velocity of the air which flows along this wall surface can be maintained strong. In addition, this air flows inside the magnetron-driving power supply almost in parallel.

Figure 3:
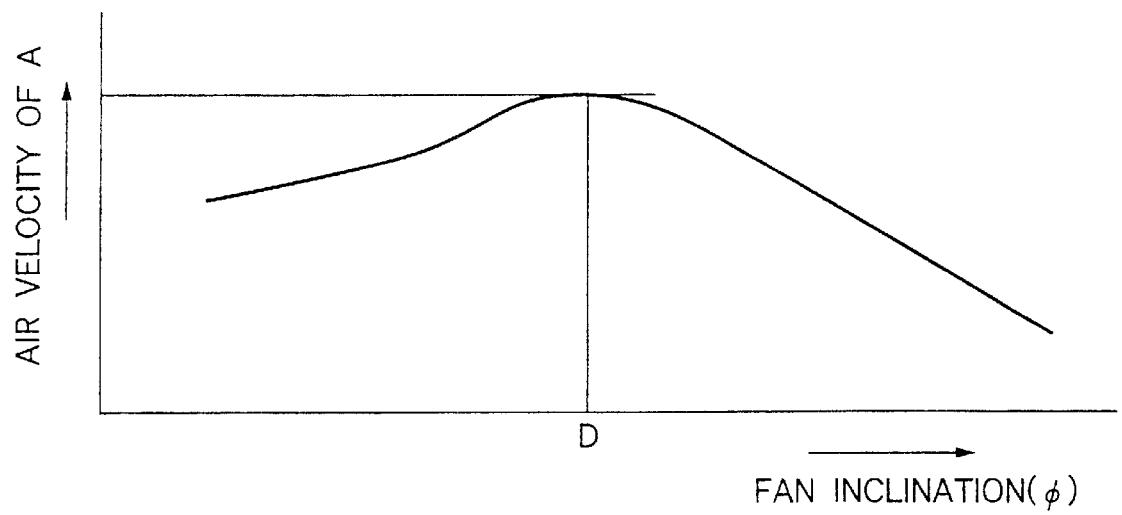
FIG. 3 is a characteristic diagram concerning cooling fan inclination and air velocity of a cooling system for a magnetron-driving power supply according to the same.

FIG. 3 is a graph showing the relationship between the angle of intersection Φ between the axial direction S of the cooling fan and the phenol board 17 of the magnetron driving power supply 12 and air velocity of the air A. If the angle of intersection Φ is small, that is, if the cooling fan becomes vertical to the phenol board of the magnetron-driving power supply, the air from the fan first contacts the upper portion of the air guide 21 and the air velocity is weakened. In addition, if the angle of intersection Φ is large, that is, if the cooling fan becomes parallel to the phenol board of the magnetron-driving power supply, the air ceases flowing to the upper portion of the air guide and the air velocity becomes weak. An angle at which the air velocity can be maximized is around 45° (D), and by optimizing this angle of intersection, the most efficient cooling construction can be realized.

Figure 4:
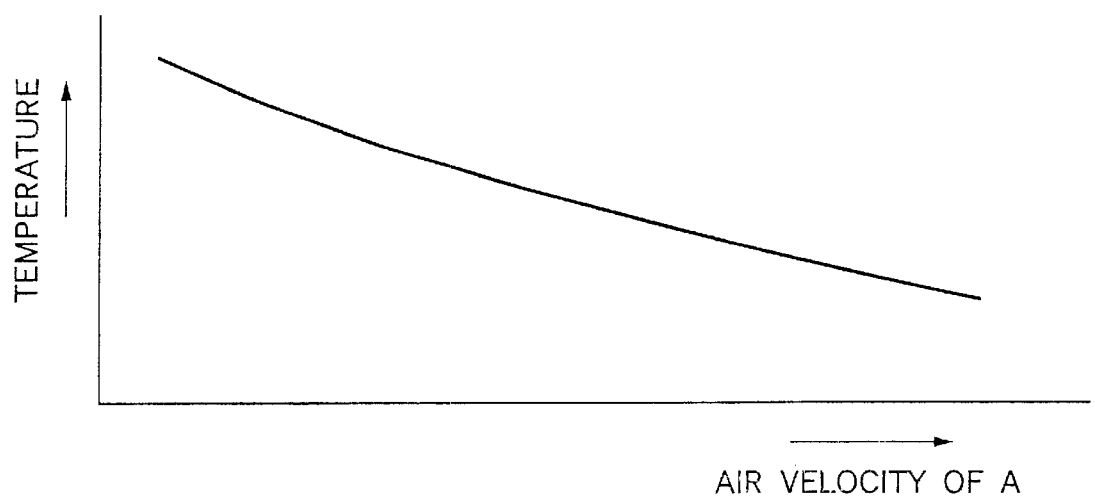
FIG. 4 is a characteristic diagram concerning cooling fan air velocity and a rise in temperature of a cooling system for a magnetron-driving power supply according to the same.

In addition, FIG. 4 is a graph showing air velocity A and temperature of the power switching element 14. An increase, due to an increase in the air velocity A, in the amount of air which passes through the radiating fin 2 connected to the power switching element 14 can realize a decline in temperature of the radiating fin, whereby a decline in temperature of the power switching element 14 can be realized. It can be understood that the greater the air velocity A becomes, the more the temperature declines, resulting in a great cooling effect. Also, in terms of temperature characteristics of the leakage transformer, similar phenomena can be considered. In the leakage transformer, the cooling effect depends on how much air can be contact against the winding portion on the surface.

Figure 5:
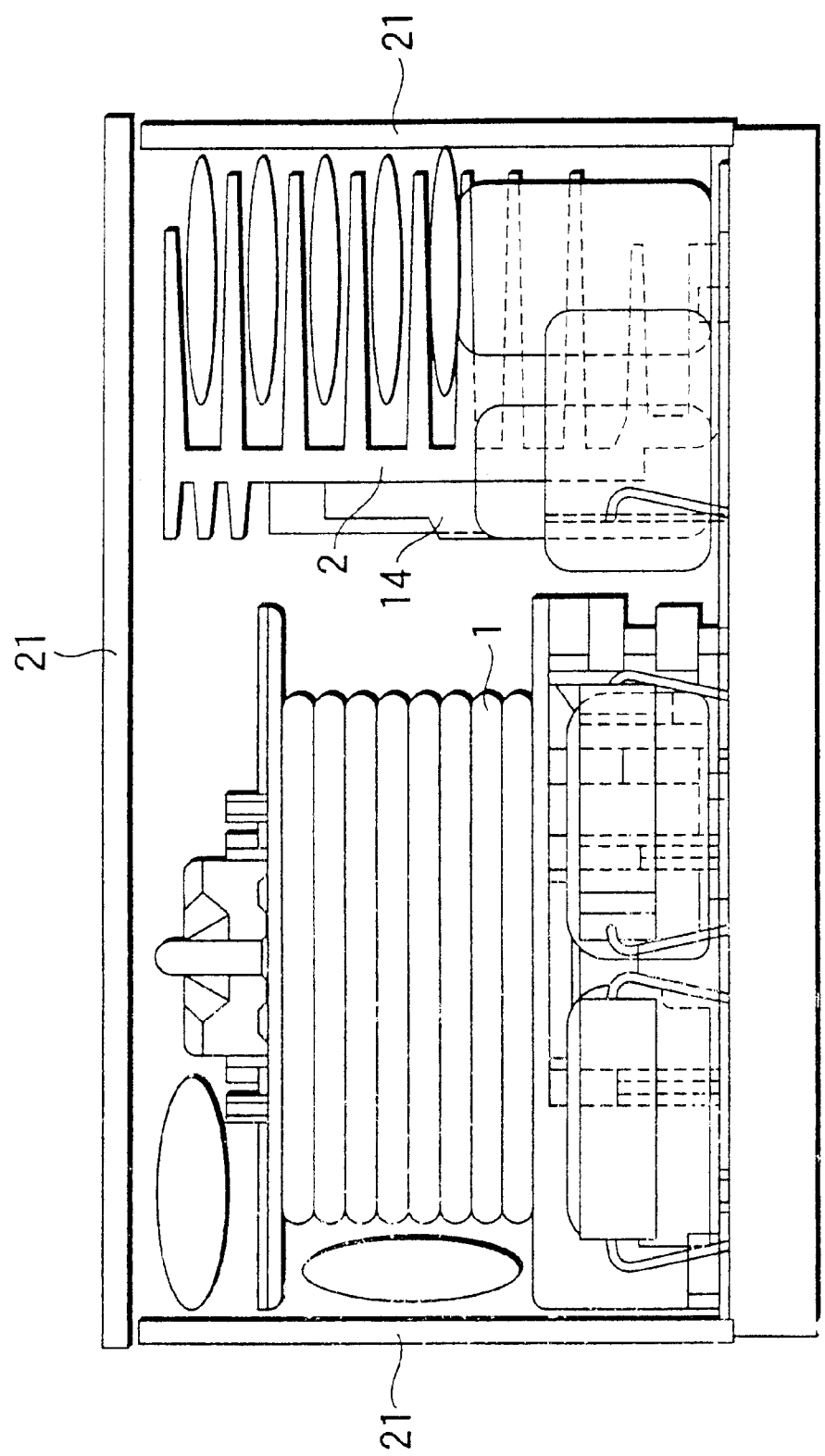
FIG. 5 is a main part sectional view showing airflow in a magnetron-driving power supply.
Figure 6:
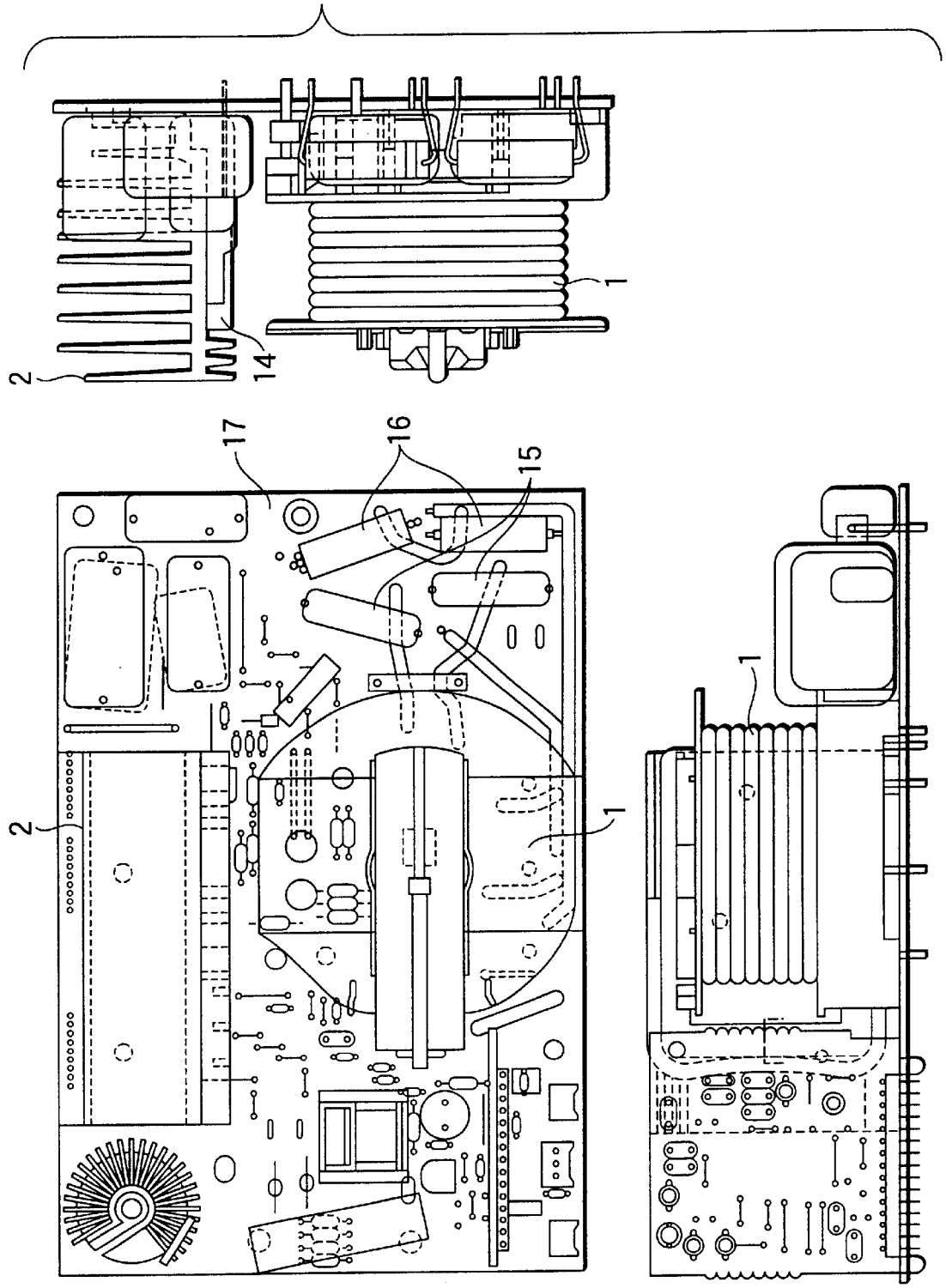
FIG. 6 is a front and side view of a prior-art magnetron-driving power supply.
Figure 7:
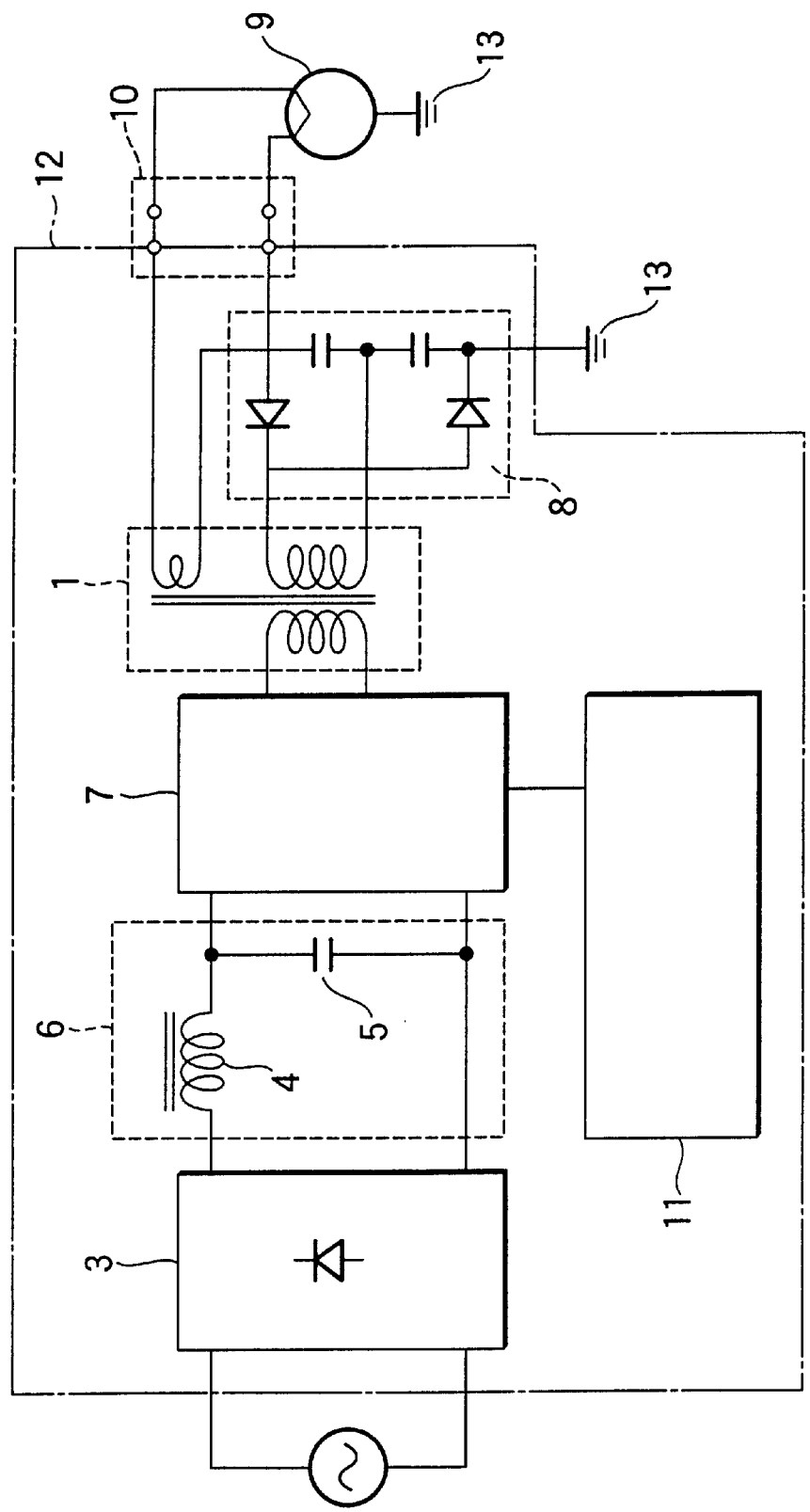
FIG. 7 is a block diagram showing a construction of a magnetron-driving power supply.
Figure 8:
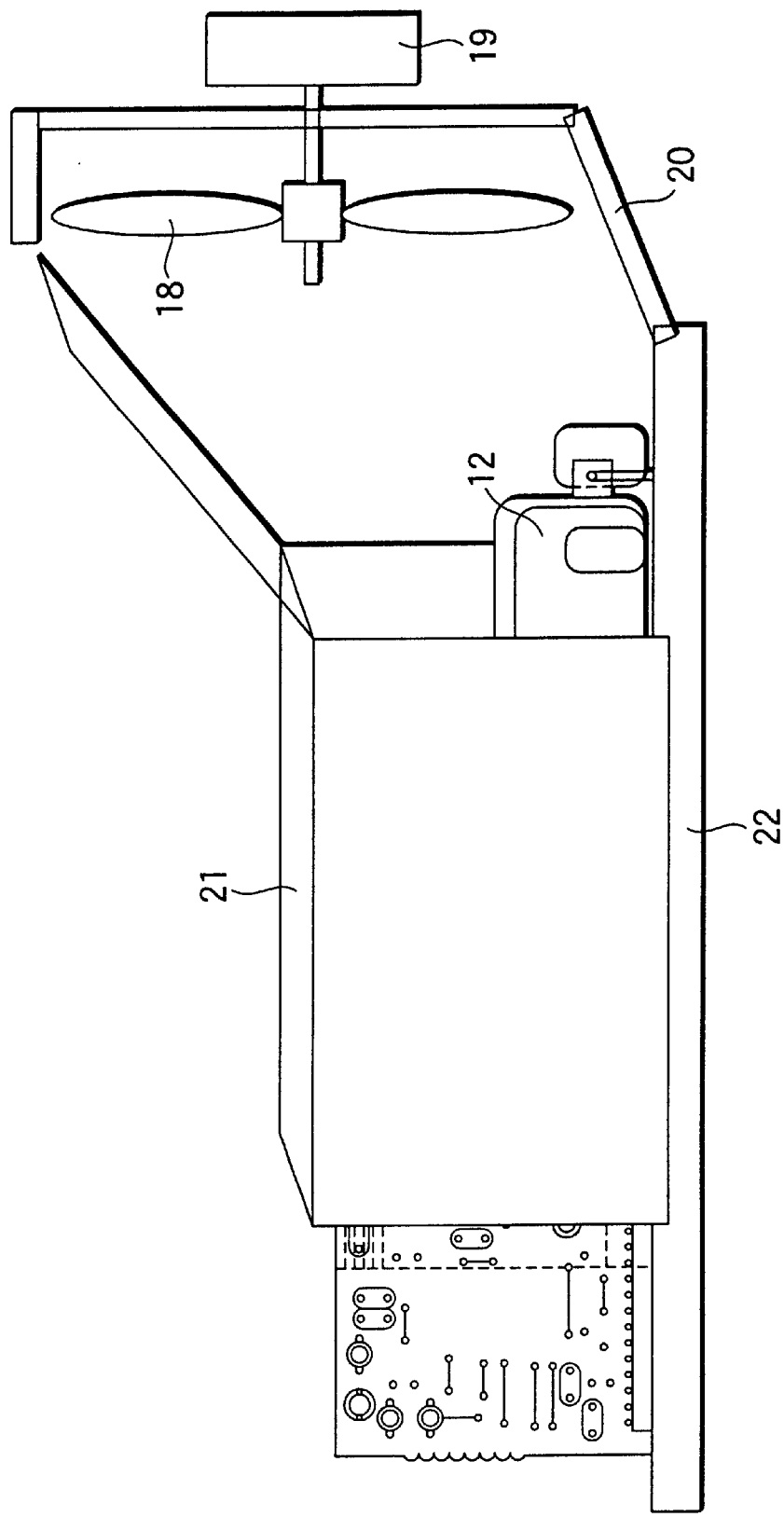
FIG. 8 is a cooling constructional view for a prior-art magnetron-driving power supply.
Figure 9:
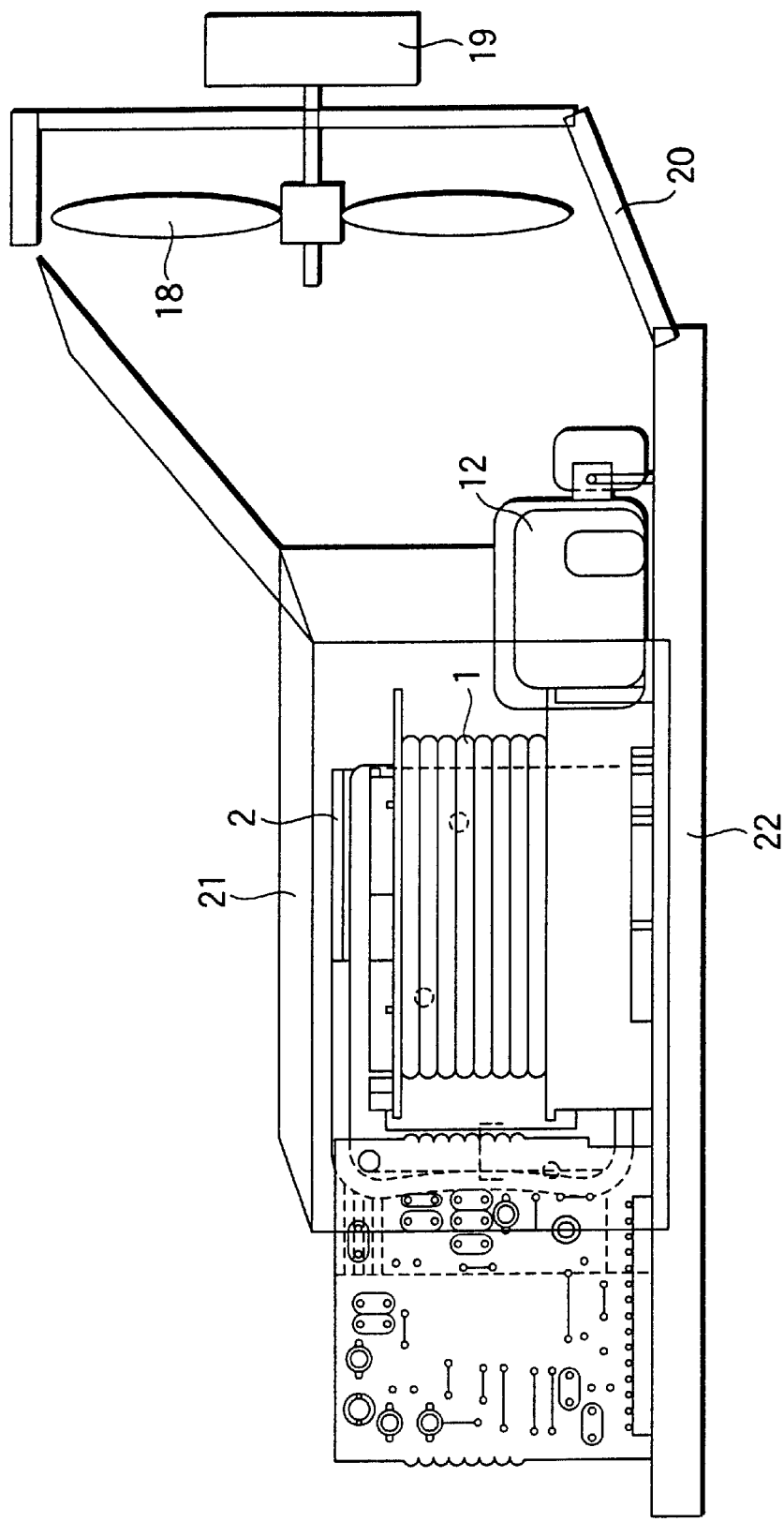
FIG. 9 is a cooling constructional view for a prior-art magnetron-driving power supply (A case of air guide-transmission)
Figure 10:
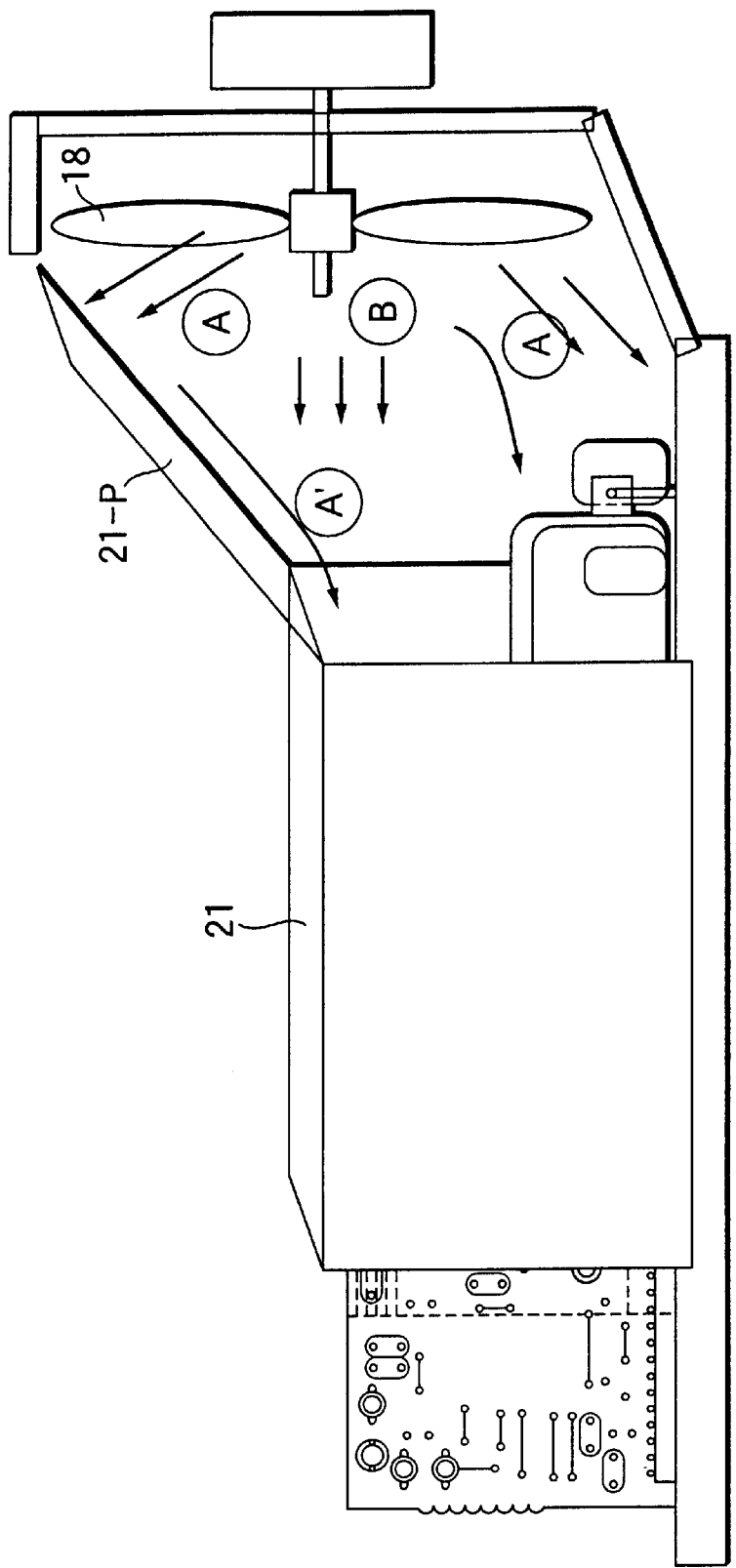
FIG. 10 is a view indicating air directions with a cooling construction for a prior-art magnetron-driving power supply.

FIG. 5 is a view showing airflow in a magnetron-driving power supply, wherein it became possible to flow air with a strong air velocity toward the shaded areas of the radiating fin 2 and the leakage transformer 1. Thereby, it becomes possible to reduce the temperature of the power switching element 14 and the leakage transformer 1. Furthermore, when taking the characteristics of air that is apt to flow along walls into consideration, a greater effect can be produced by narrowing the distance between the air guide wall surface and the radiating fin 2 or the leakage transformer 1.

As in the above, by employing the construction wherein the cooling fan is arranged so that the angle of intersection Φ between the axial direction of the cooling fan and the phenol board 17 of the magnetron-driving power supply 12 becomes an optimal angle and the cooling fan is latched with one end of the air guide, it becomes possible to efficiently guide air from the cooling fan to the magnetron-driving power supply, therefore, cooling efficiency for the magnetron-driving power supply is remarkably improved.

(Second embodiment)

Figure 11:
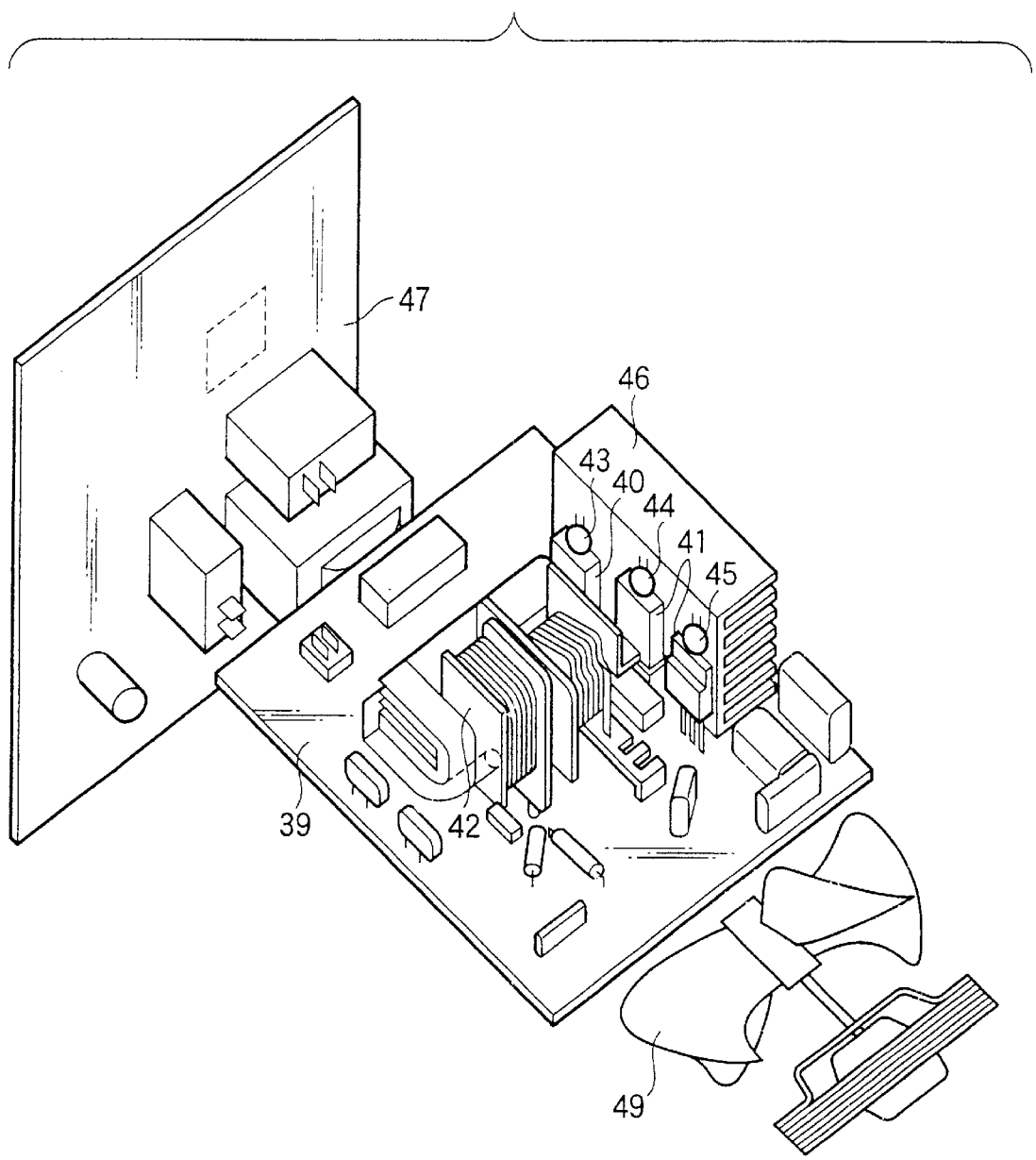
FIG. 11 is a perspective view showing the main part of an inverter power supply of a high-frequency heating apparatus according to a second embodiment of the invention.
Figure 12:
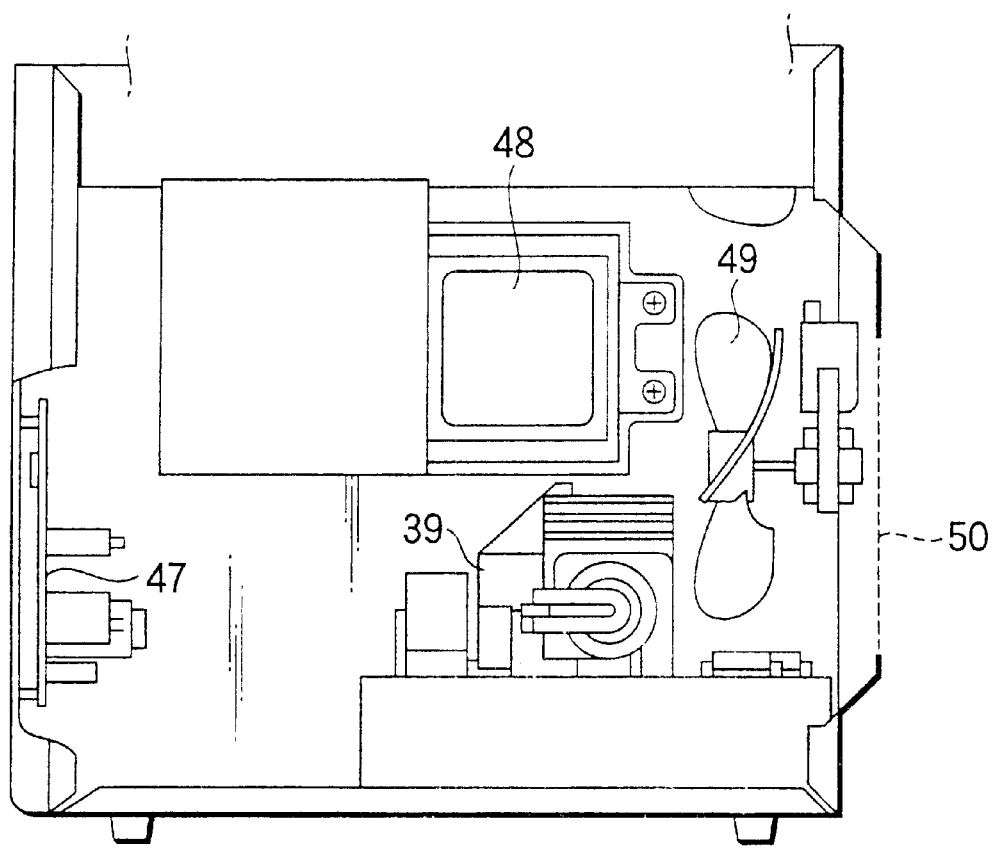
FIG. 12 is a cross sectional view showing a machine chamber for containing the inverter power supply of the high-frequency heating apparatus shown in FIG. 11.

FIG. 11 is a perspective view showing the main part of an inverter power supply of a high-frequency heating apparatus according to the second embodiment of the invention. FIG. 12 is a cross sectional view showing a machine chamber for containing the inverter power supply of the high-frequency heating apparatus.

In FIG. 11, numeral 39 indicates an inverter power supply. Numerals 40 through 42 indicate components installed in the inverter power supply 39. More specifically, numeral 40 indicates a semiconductor rectifier element for rectifying the commercially available electric power. Numeral 41 indicates a semiconductor switching element for converting the rectified power into high-frequency power. Numeral 42 indicates a high-voltage transformer for converting the high-frequency power into high voltage. Numeral 43 indicates a temperature sensor "a" for detecting the temperature of the semiconductor rectifier element 40. Numerals 44 and 45 indicate temperature sensors "b" and "c" for detecting the temperature of the semiconductor switching elements 41. Numeral 46 indicates a heat radiation fin to which the semiconductor rectifier element 40 and the semiconductor switching elements 41 are attached. Numeral 47 indicates a controlling means which has a micro computer and thereby controls the inverter power supply and the entirety of the high-frequency heating apparatus.

In FIG. 12, numeral 48 indicates a magnetron for generating high-frequency power. Numeral 49 indicates a cooling fan for cooling the inverter power supply 39 and the magnetron 48 Numeral 50 indicates an air inlet.

Described below are the operation and the effect of the high-frequency heating apparatus having the above-mentioned configuration. In high-frequency heating, the inverter power supply 39, the magnetron 48, and the cooling fan 49 operate according to the heating condition (high-frequency output level and heating time) set by a user. The machine chamber is cooled by air taken by the cooling fan through the air inlet 50 from the outside. The controlling means 47 obtains the temperature information of the semiconductor rectifier element 40 and the semiconductor switching elements 41 through the temperature sensor "a" 43 and the temperature sensors "b" 44 and "c" 45. In the micro computer in the controlling means 47, set in advance is a temperature level which is below the heat resistivity limit of the semiconductor rectifier element 40 and the semiconductor switching elements 41 and not reached in the normal operation of the high-frequency heating apparatus. The micro computer compares the temperature information obtained through the temperature sensor "a" 43 and the temperature sensors "b" 44 and wicks 45 with the above-mentioned temperature level set in advance. In case where the temperature information reaches the temperature level set in advance, the micro computer determines an abnormality, and thereby reduces the output of the inverter power supply, or alternatively terminates the operation of high-frequency heating.

According to this structure, even in a case where the cooling condition of the inverter power supply 39 becomes abnormal due to a failure in the cooling fan 49 or clogging in the air inlet 50, thermal damage is avoided in the semiconductor rectifier element 40 and the semiconductor switching elements 41.

In this embodiment, each of the semiconductor rectifier element 40 and the semiconductor switching elements 41 is provided with a temperature sensor. However, depending on the arrangement of the inverter power supply 39 and the cooling fan 49, the values of the temperature rise in the semiconductor rectifier element 40 and the semiconductor switching elements 41 become substantially diverse. In this case, a temperature sensor may be provided in the component having the most severe temperature condition, whereby the same effect is obtained.

(Third embodiment)

Figure 13:
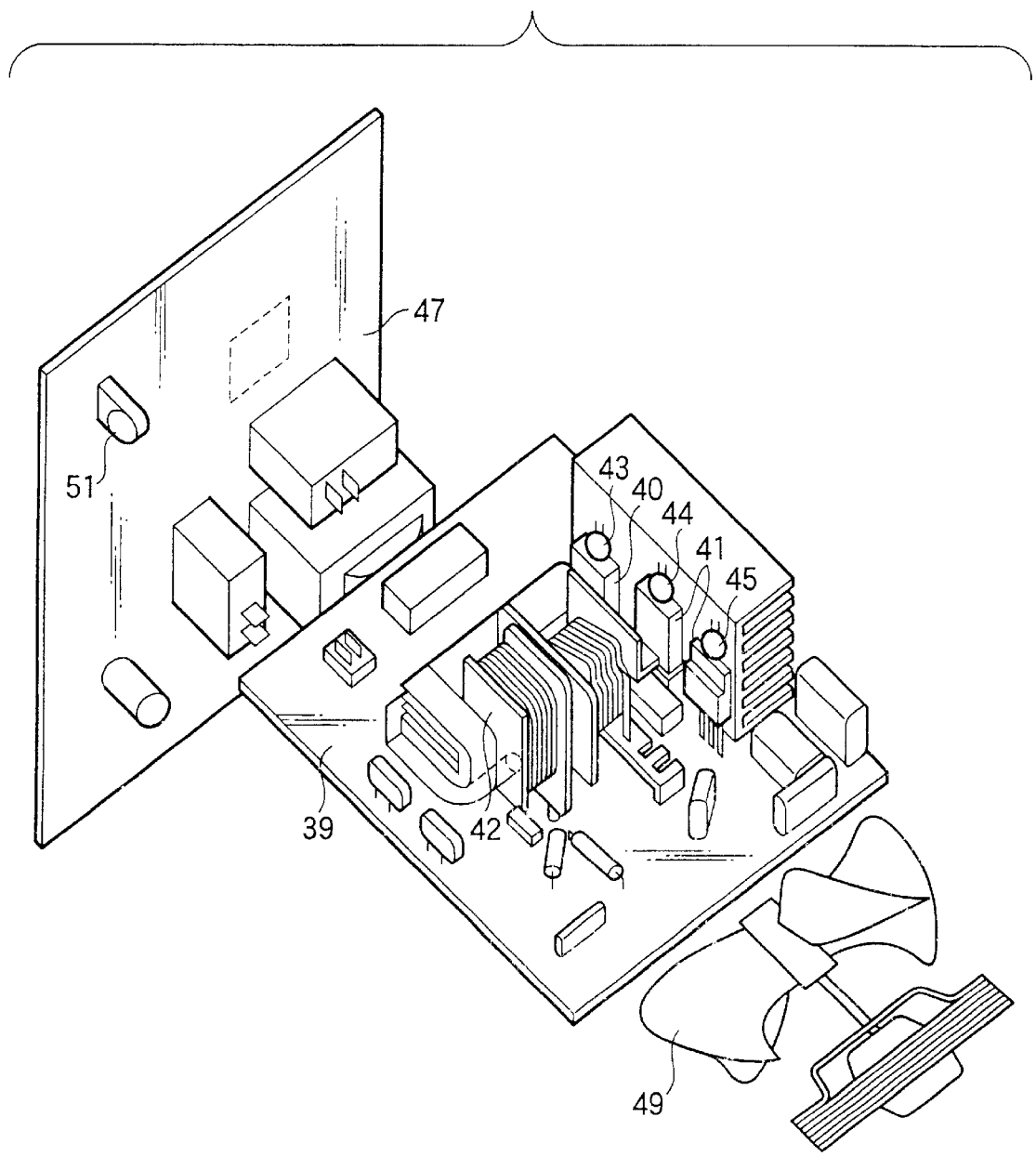
FIG. 13 is a perspective view showing the main part of an inverter power supply of a high-frequency heating apparatus according to a third embodiment of the invention.

FIG. 13 is a perspective view showing the main part of an inverter power supply of a high-frequency heating apparatus according to the third embodiment of the invention. In FIG. 13, numeral 51 indicates a notifying means composed of a buzzer provided on the same board as that of the controlling means 47. This notifying means 51 is the only difference from the structure of the second embodiment. Like numerals to the second embodiment designate like components, and hence descriptions are omitted.

Similarly to the second embodiment, the controlling means 47 obtains the temperature of the semiconductor rectifier element 40 and the semiconductor switching elements 41 through the temperature sensor "a" 43 and the temperature sensors "b" 44 and "c" 45. In a case where an abnormal temperature rise is detected, the operation of the high-frequency heating apparatus is terminated. At the same time, the notifying means 51 notifies the abnormality to a user.

According to this configuration, in a case where the cooling condition of the inverter power supply becomes abnormal, the operation of the high-frequency heating apparatus is terminated. At the same time, the notifying means 51 (buzzer) notifies immediately about the abnormality to the user.

In this embodiment, a buzzer has been used as the notifying means. However, in a high-frequency heating apparatus having a displaying means for displaying the setting of high-frequency heating, the remaining time of heating, and the like, the abnormality may be displayed on the displaying means serving as the notifying means of an abnormality. Also in this case, the same effect is obtained.

(Forth embodiment)

Figure 16:
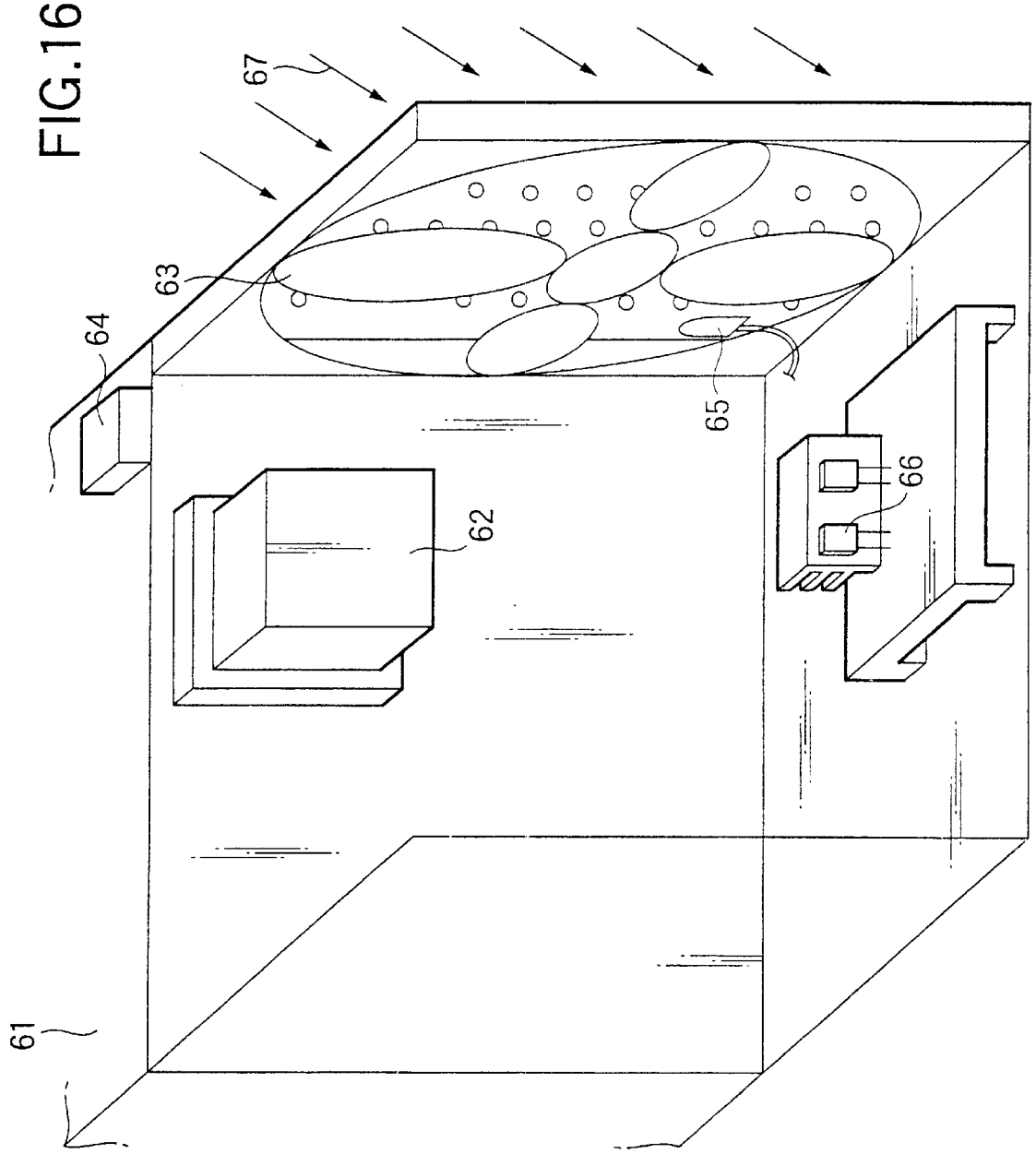
FIG. 16 is a diagram showing the configuration of a high-frequency heating apparatus according to a forth embodiment of the invention.

FIG. 16 is a configuration diagram showing a high-frequency heating apparatus according to the present example of the invention. In FIG. 16, numeral 61 indicates a heating chamber. Numeral 62 indicates a power supply apparatus. Numeral 63 indicates cooling means for cooling the power supply apparatus. Numeral 64 indicates an automatic cooking detection sensor. Numeral 65 indicates a temperature detecting means for detecting a temperature change. Numeral 66 indicates a component having high self-heat generation in the power supply apparatus. Numeral 67 indicates a cooling air inlet section.

In FIG. 16, when heating of a target of heating is started, the component temperature of the power supply apparatus rises gradually owing to self-heat generation. In particular, the component 66 having high self-heat generation in the power supply apparatus can suffer overheat damage due to temperature rise in the cooling air caused by a change in the ambient temperature environment. In this example of the invention, temperature detecting means is provided on the surface of a component easily influenced by a change in the inlet temperature of the cooling air, as shown in the figure. Accordingly, even when the cooling air temperature rises owing to a rise in the ambient temperature environment such as in a kitchen, the component 6 having high self-heat generation in the power supply apparatus can be protected from overheat damage. Further, the power is controlled when the temperature reaches the temperature limit for securing performance of the automatic cooking detection sensor. At that time, the temperature change in the component is read and determined by a microcomputer, whereby instead of terminating all power, the power can be temporarily reduced to a level not exceeding the temperature limit. This prevents overheat damage to the component, and at the same time, permits stable completion of cooking instead of sudden termination in cooking by mechanical means. Further, during the power control, the display section displays a message "Heating-power controlled," whereby a change in the cooking time is clearly notified to the user.

Figure 17:
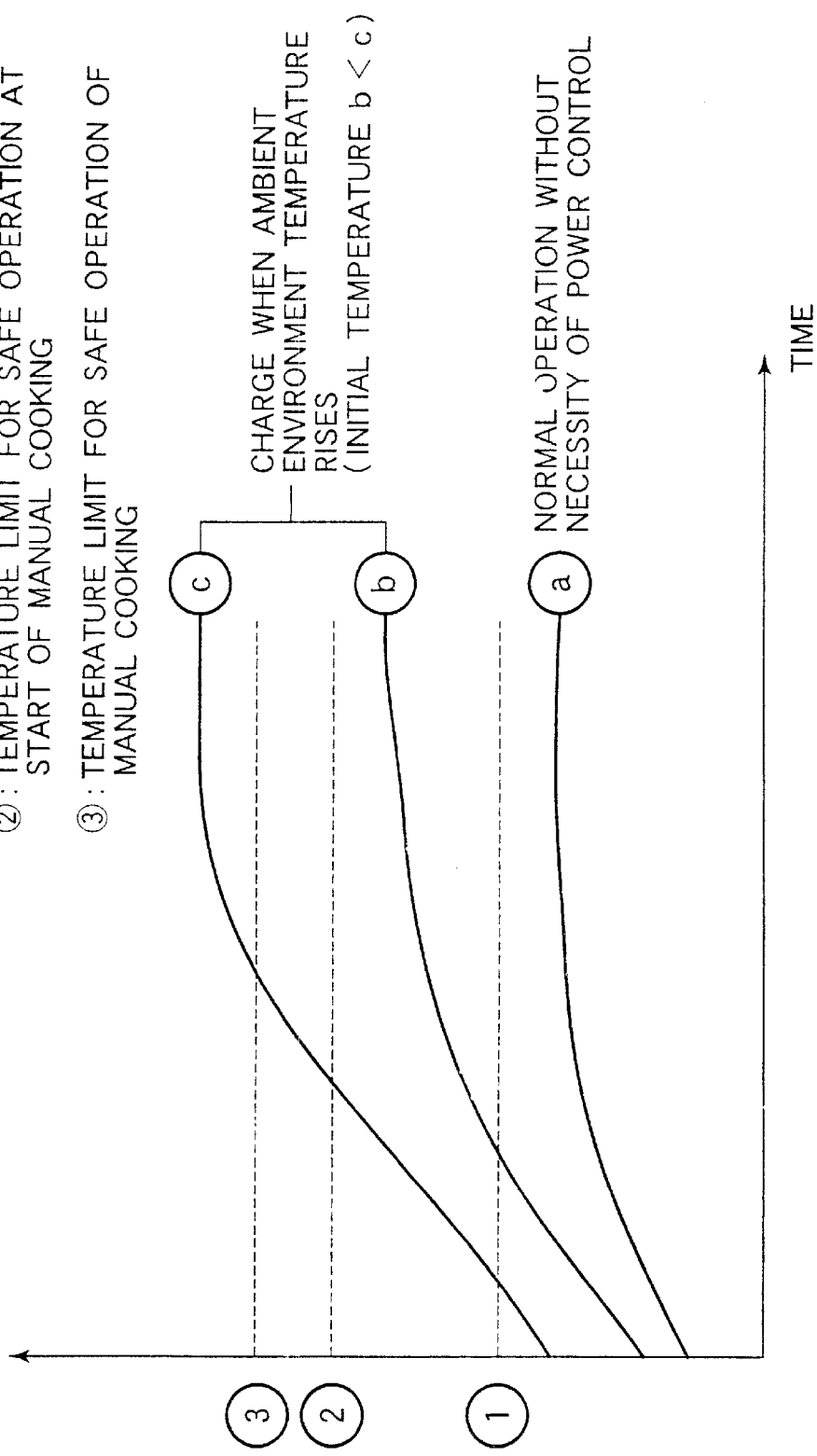
FIG. 17 is a diagram showing the temperature change during high-frequency heating, detected by a temperature detecting means of the high-frequency heating apparatus shown in FIG. 16.

FIG. 17 is a diagram showing the relationship between the temperature change detected by the temperature detecting means 65 and the temperature limits before and after the start of power control. In FIG. 17, the temperature detected by the temperature detecting means 65 shown in FIG. 16 rises as shown in the figure after the start of power supplying.

Figure 18:
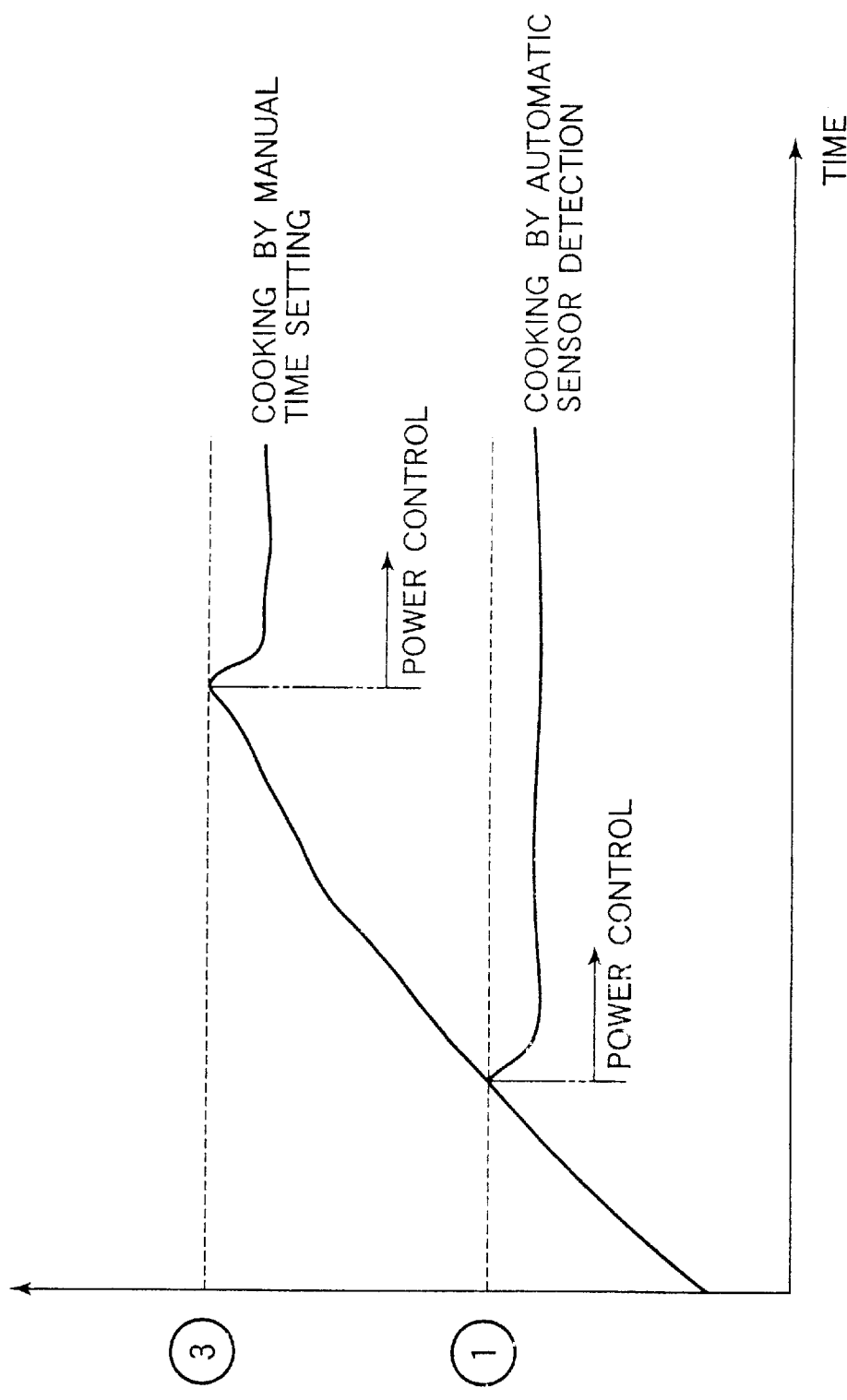
FIG. 18 is a diagram showing the temperature change during power control, detected by a temperature detecting means of the high-frequency heating apparatus shown in FIG. 16.

FIG. 18 is a diagram showing the temperature change detected by the temperature detecting means 65 during power control when the temperature was below the temperature limit at the start of cooking, and after the temperature detected by the temperature detecting means 65 reached the temperature limit during cooking. In FIG. 18, when the temperature detected by the temperature detecting means 65 reaches the temperature limit which is set as shown in the figure, the power is controlled on the basis of the determination by the micro computer. By virtue of this, not only in manual setting but also in automatic cooking, the power supplying is continuously carried out within a temperature range below the temperature limit, whereby sufficient quality is obtained.

Figure 19:
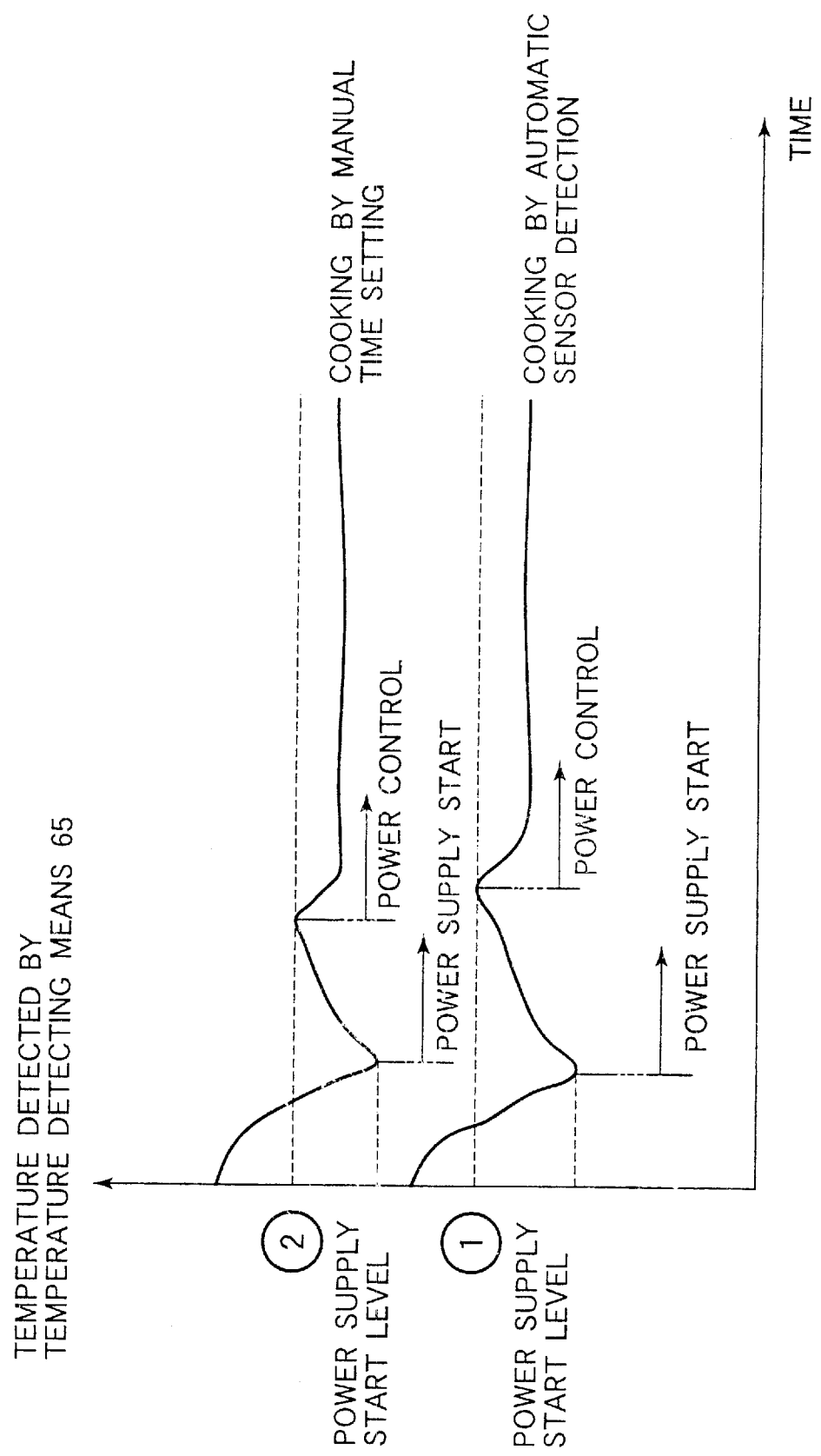
FIG. 19 is a diagram showing the temperature change detected by a temperature detecting means of the high-frequency heating apparatus shown in FIG. 16, in a case where the cooling air temperature was above the temperature limit at the start of cooking.

FIG. 19 is a diagram showing the change in the power control depending on the temperature detected by the temperature detecting means 65, when the temperature was above the temperature limit at the start of cooking. In FIG. 19, the power is terminated until the temperature detected by the temperature detecting means 65 falls below the temperature limit, and further until the temperature reaches the power supply start level. In this case, the display section displays a message "Heating-power controlled," whereby the reason for the termination of power is clearly notified to the user. The change in power control after the start of power supplying is the same as that shown in FIG. 18.

Figure 20:
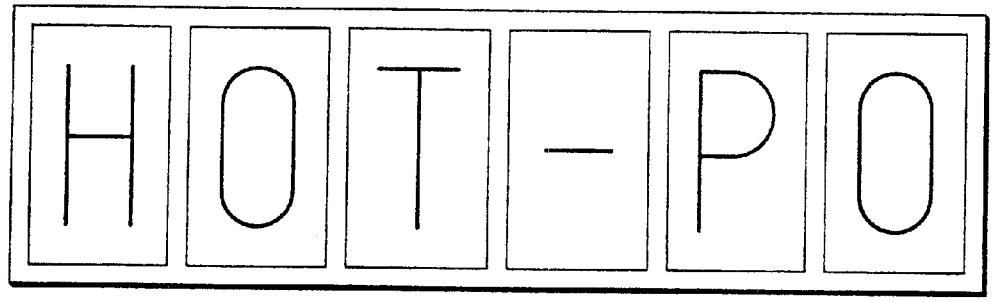
FIG. 20 is a diagram showing an example of a method for display during power control in the high-frequency heating apparatus shown in FIG. 16.
Figure 14:
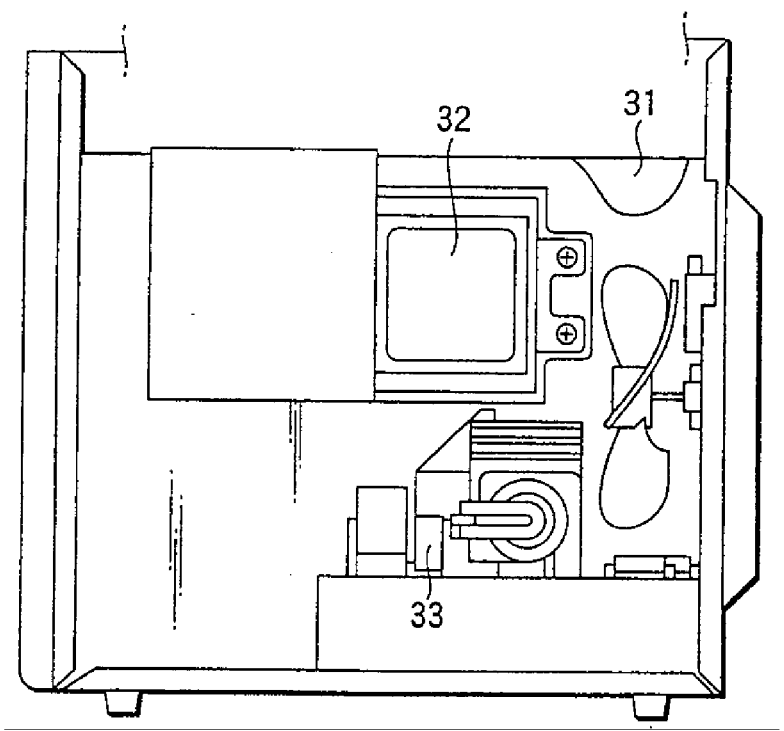

FIG. 20 is a diagram showing an example of a method of display during power control according to the present example of the invention. As such, a condition where cooking is delayed during power control or where heating is stopped is notified clearly to the user.

As such, in this embodiment, the detecting means 65 detects the temperature change in the cooling air of the high-frequency heating apparatus, whereby the power is easily controlled on the basis of a determination by the micro computer so as not to exceed the various guaranteed temperature limits of the components which affect safety and performance. This prevents overheat damage to the components, and at the same time, secures the automatic cooking performance by sensor detection. Further, in this example, a condition where the cooking is delayed during power control or where heating is stopped is displayed and notified clearly to the user.

As has been described above, according to the present invention, air from the cooling fan can be efficiently guided to the magnetron-driving power supply via the air guide and cooling efficiency can be improved. Moreover, the cooling fan can be latched with the air guide and arranged near the magnetron-driving power supply, thereby saving space for the cooling mechanism.

As described above, according to the invention of claims 2 and 3, even in a case where the cooling condition of the inverter power supply becomes abnormal, thermal damage is avoided in the inverter power supply.

As such, according to the invention of claims 1 and 2, the temperature change in the cooling air for preventing overheat damage to the components and in the components affected by the temperature thereof in the vicinity of the cooling air is detected, whereby the power is controlled. By virtue of this, a simple configuration permits a guarantee of the components of various specifications which affect safety and performance.

What is claimed is:

1. A cooling system for a magnetron-driving power supply comprising:
   a magnetron-driving power supply provided on a printed board and including:
      a radiating fin formed by an aluminum extrusion molding method and mounted on a power switching element having an IGBT and such thereon;
      an inverter portion;
      an inverter controlling portion for controlling the inverter portion;
      a leakage transformer for booting a high-frequency alternating voltage; and
      a high voltage rectifying means for applying direct current high voltage to a magnetron connected to a secondary winding of the leakage transformer;
   a cooling fan for forcedly cooling the magnetron-driving power supply; and
   an air guide for guiding air from the cooling fan to the magnetron-driving power supply; and
   wherein the inverter portion turns on/off electric power of a commercial power supply power at high speed by means of the power switching element and converting the electric power to a high-frequency alternating voltage,
   wherein the radiating fin cools the power switching element by dispersing loss, which occurs in a closely bound manner with the power switching element, and
   wherein an axial direction of the cooling fan intersects the printed wiring board of the magnetron-driving power supply at an acute angle and one end of an opening portion of the air guide is latched with the cooling fan.

2. A high-frequency heating apparatus comprising:
   a magnetron-driving power supply including:
      a semiconductor rectifier element for rectifying the commercially available electric power;
      semiconductor switching elements for converting the rectified power into high-frequency power; and
      a high-voltage transformer for converting the high-frequency power into high voltage and thereby supplying the power to a magnetron;
   controlling means which has a microcomputer and thereby controls the magnetron-driving power supply and the entirety of the apparatus; and
   temperature sensors for detecting the temperature of the semiconductor rectifier device and the semiconductor switching elements in the magnetron-driving power supply; and
   wherein on the basis of the information from the temperature sensor provided to one of the semiconductor rectifier device and the semiconductor switching elements having the most severe temperature fluctuation, the controlling means reduces the output of the inverter power supply, or alternatively terminates the operation of high-frequency heating.

3. A high-frequency heating apparatus comprising:
   a magnetron-driving power supply including:
      a semiconductor rectifier element for rectifying the commercially available electric power;
      semiconductor switching elements for converting the rectified power into high-frequency power; and
      a high-voltage transformer for converting the high-frequency power into high voltage and thereby supplying the power to a magnetron;
   controlling means which has a micro computer and thereby controls the output of the inverter power supply and the entirety of the apparatus;
   temperature sensors provided to the semiconductor rectifier element and the semiconductor switching elements for detecting the temperature of the semiconductor rectifier element and the semiconductor switching elements in the magnetron-driving power supply; and
   notifying means for notifying an abnormality in the magnetron-driving power supply; and
   wherein the controlling means detects an abnormality in the magnetron-driving power supply by means of the temperature sensors, thereby terminates the operation of high-frequency heating, and notifies about the abnormality by means of the notifying means.

4. A high-frequency heating apparatus comprising:
   a heating chamber for containing a heating target;
   means for heating the target of heating;
   means for cooling the heat generation of a power supply apparatus;
   an automatic cooking detection sensor for determining the heating state of the target of heating and thereby controlling the method of heating;
   a micro computer for determining the signal and controlling the power; and
   an apparatus for detecting the temperature change in cooling air being supplied to the power supply apparatus, the apparatus for detecting the temperature change in cooling air being provided in the vicinity of a cooling air inlet; and
   wherein, by the apparatus for detecting the temperature change, the cooling air cools components including high self-heat generation in the power supply apparatus and the automatic cooking detection sensor and controls the power depending on the temperature change in order to protect the power supply apparatus from overheating and secure the detection performance of the automatic cooling detection sensor.

5. A high-frequency heating apparatus according to claim 4, further comprising:
   a display apparatus for notifying, to a user, that the power is under control or in a stopped state for the purpose of overheat protection of the power supply apparatus and securing the operation performance of the cooking detection sensor.

6. A high-frequency heating apparatus comprising:
   a heating chamber for containing a heating target;
   means for heating the target of heating;
   means for cooling the heat generation of a power supply apparatus;
   an automatic cooking detection sensor for determining the heating state of the target of heating and thereby controlling the method of heating;
   a micro computer for determining the signal and controlling the power; and
   an apparatus for detecting the temperature change in cooling air, the apparatus being provided in the vicinity of a cooling air inlet through which ambient air enters the high frequency heating apparatus; and
   wherein, by the apparatus for detecting the temperature change, the cooling air cools components including high self-heat generation in the power supply apparatus and the automatic cooking detection sensor and controls the power depending on the temperature change in order to protect the power supply apparatus from overheating and secure the detection performance of the automatic cooling detection sensor.

7. A cooling system for a magnetron-driving power supply provided on a printed board and comprising a semiconductor rectifier element for rectifying the commercially available electric power; semiconductor switching elements for converting the rectified power into high-frequency power; and a high-voltage transformer for converting the high-frequency power into high voltage and thereby supplying the power to a magnetron; the cooling system comprising:

controlling means which has a microcomputer and thereby controls the cooling system;

temperature sensors for detecting the temperature of the semiconductor rectifier device and the semiconductor switching elements in the magnetron-driving power supply;

a cooling fan for cooling the magnetron-driving power supply; and an air guide for guiding air from the cooling fan to the magnetron-driving power supply, wherein an axial direction of the cooling fan intersects the printed board of the magnetron-driving power supply at an acute angle and one end of an opening portion of the air guide is latched with the cooling fan.

* * * * *

UNITED STATES PATENT AND TRADEMARK OFFICE
CERTIFICATE OF CORRECTION

PATENT NO. : 6,677,562 B2
DATED : January 13, 2004
INVENTOR(S) : Kosho Oshima et al.

Figure 14:
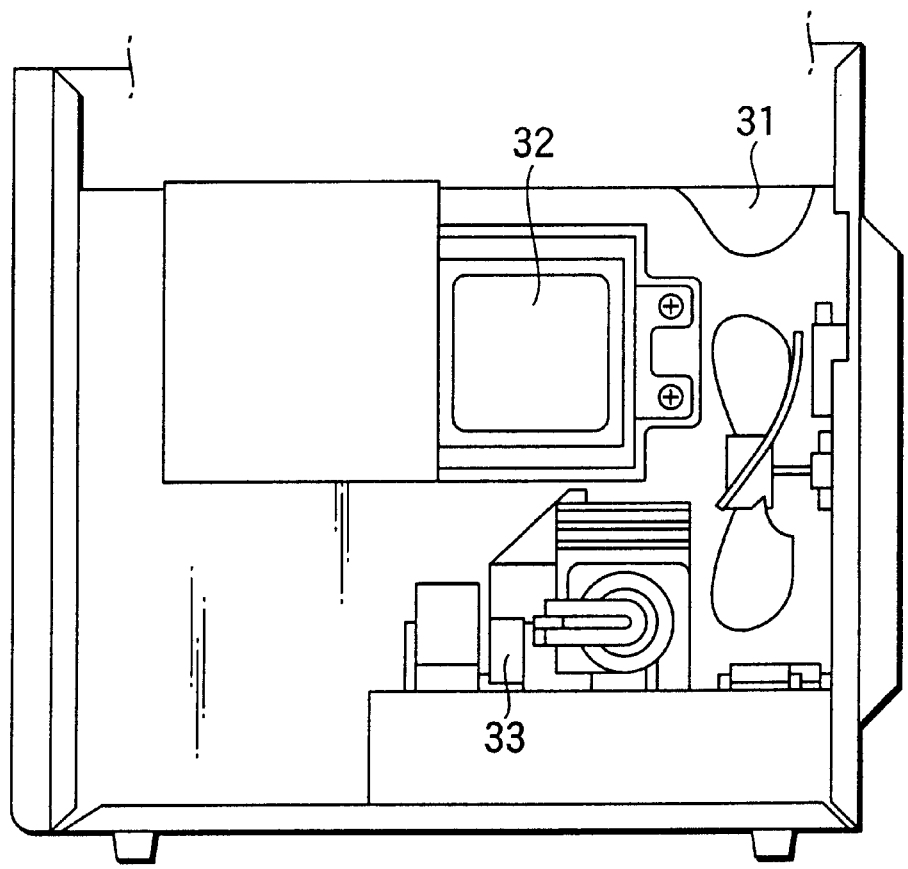
FIG. 14 is a cross sectional view showing a power supply section of a high-frequency heating apparatus according to the prior art.
Figure 15:
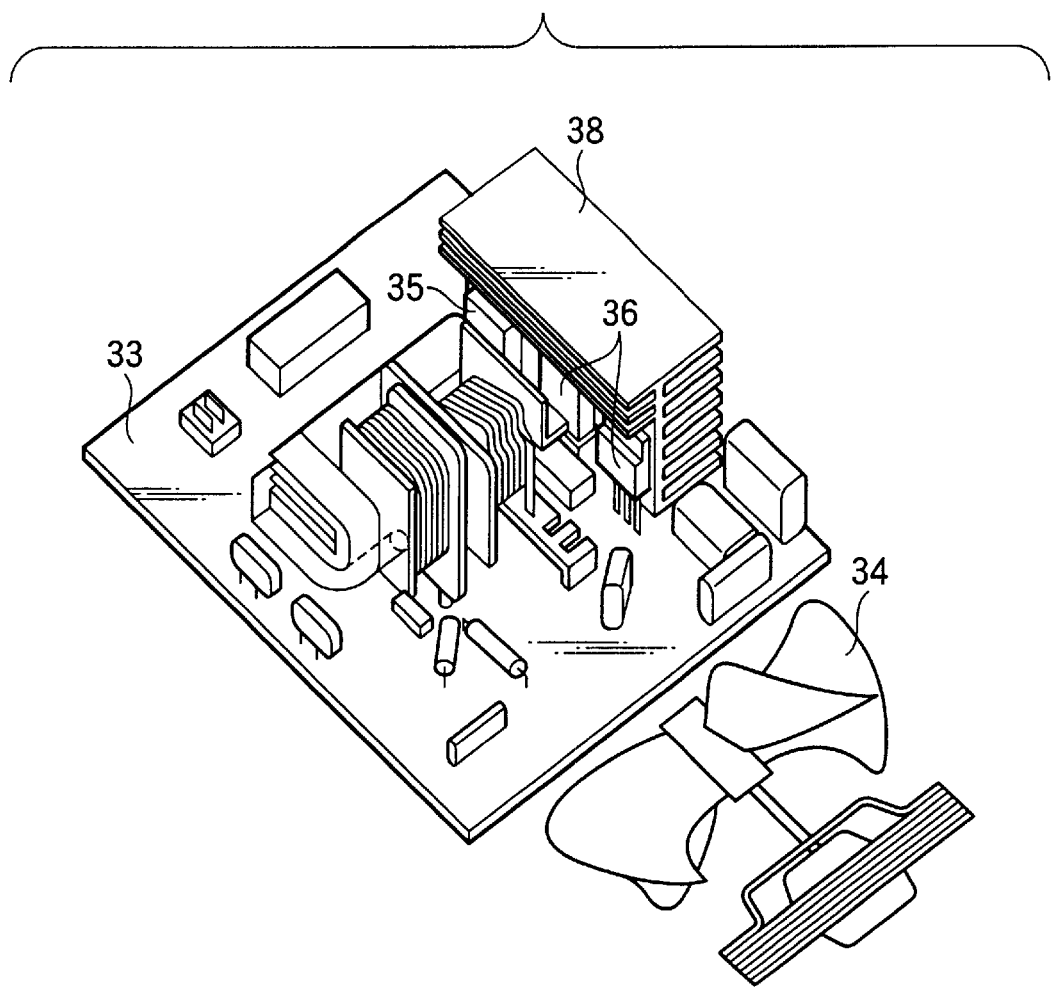
FIG. 15 is a perspective view showing the appearance of an inverter power supply of the high-frequency heating apparatus shown in FIG. 14.

It is certified that error appears in the above-identified patent and that said Letters Patent is hereby corrected as shown below:

Drawings,
Please delete Sheet 14 of 20, which contains Fig. 14, and insert the attached Fig. 14.

Column 8,
Line 16, after "48", please insert -- . -- (period).
Line 36, please delete "wicks", and insert therefor -- "c" --.

Signed and Sealed this

Fourteenth Day of December, 2004

JON W. DUDAS
*Director of the United States Patent and Trademark Office*